United States Patent [19]

Kunitomo et al.

[11] Patent Number: 4,816,782

[45] Date of Patent: Mar. 28, 1989

[54] MODULATION SENSITIVITY CORRECTION CIRCUIT FOR VOLTAGE-CONTROLLED OSCILLATOR

[75] Inventors: Kouichi Kunitomo; Mikio Hanabusa, both of Yokohama, Japan

[73] Assignee: Matsushita Electric Industrial Co., Ltd., Kadoma, Japan

[21] Appl. No.: 95,366

[22] Filed: Sep. 11, 1987

[30] Foreign Application Priority Data

Sep. 12, 1986 [JP] Japan ............................ 61-216654

[51] Int. Cl.[4] ...................... H03C 3/00; H03L 7/06; H03L 7/18
[52] U.S. Cl. ...................................... 332/19; 331/17
[58] Field of Search ................... 332/19; 331/10, 16, 331/17, 18, 23, 25; 375/97; 455/76, 77, 113, 183, 192, 260

[56] References Cited

U.S. PATENT DOCUMENTS

| | | | |
|---|---|---|---|
| 4,127,819 | 11/1978 | Keane | 331/9 |
| 4,388,596 | 6/1983 | Yamashita | 331/25 X |
| 4,528,522 | 7/1985 | Matsuura | 331/23 X |
| 4,554,517 | 11/1985 | Parniere et al. | 332/18 |

FOREIGN PATENT DOCUMENTS

| | | |
|---|---|---|
| 0153868 | 9/1985 | European Pat. Off. |
| 1556392 | 11/1979 | United Kingdom |
| 2031676 | 4/1980 | United Kingdom |

Primary Examiner—Eugene R. LaRoche
Assistant Examiner—David Mis
Attorney, Agent, or Firm—Spencer & Frank

[57] ABSTRACT

A modulation sensitivity correction circuit in which a phase-locked loop includes a voltage-controlled oscillator (VCO) and a phase detector. When an audio signal is applied to the VCO through an electronic volume control so as to be modulated, control for the electronic volume control is effected by using a control voltage obtained by applying an output of the phase detector to a conversion circuit having a characteristic which is the reverse of the modulation sensitivity characteristic of the VCO, so that the modulation sensitivity can be kept constant over a wide band.

7 Claims, 7 Drawing Sheets

MODULATION SENSITIVITY CORRECTION CIRCUIT FOR VOLTAGE-CONTROLLED OSCILLATOR

BACKGROUND OF THE INVENTION

1. Field of the Invention

The present invention relates to a modulation sensitivity correction circuit for a voltage-controlled oscillator, and particularly relates to a modulation sensitivity correction circuit for substantially equalizing modulation sensitivity of a voltage-controlled oscillator in a frequency synthesizer used for land mobile telephone or the like.

2. Description of the Prior Art

Figure 3:
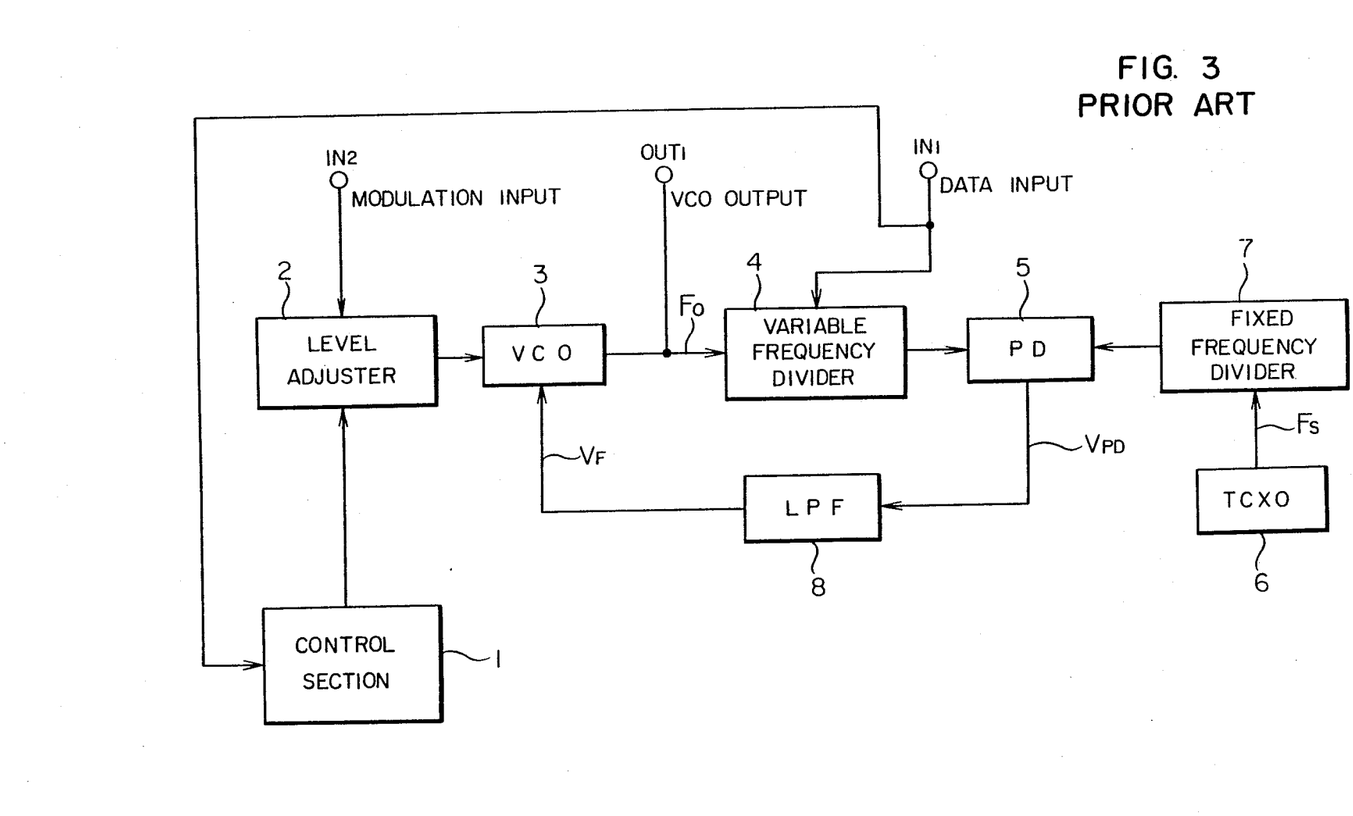
FIG. 3 is a block diagram showing the prior art.

FIG. 3 shows a conventional phase-locked loop (PLL) synthesizer which is provided with: a control section 1 for converting channel data received at a data input terminal $IN_1$ into a channel signal; a level adjuster 2 for stepwise changing the level of a modulation signal for frequency modulation or the like such as an audio signal applied through another input $IN_2$ on the basis of the channel signal from the control section 1; a voltage-controlled oscillator (VCO) 3; a variable frequency divider 4 for dividing the oscillation frequency $F_0$ of the VCO 3 into a predetermined frequency on the basis of the data from the data input terminal $IN_1$; a phase detector (PD) 5; a temperature-compensated crystal oscillator (TCXO) 6 which acts as a highly stable reference oscillator; a fixed frequency divider 7 for dividing the oscillation frequency $F_s$ of the TCXO 6 into a predetermined frequency; a low pass filter (LPF) 8 for eliminating useless noises; and an output terminal $OUT_1$ for the VCO 3.

In the thus arranged circuit, the oscillation frequency $F_0$ of the VCO 3 is divided by the variable frequency divider 4 into a predetermined frequency which is in turn applied to the PD 5 on one hand, and the oscillation frequency $F_s$ of the TCXO 6 is divided by the fixed frequency divider 7 into a predetermined frequency which is in turn applied also to the PD 5 on the other hand. The respective output signals of the variable frequency divider 4 and the fixed frequency divider 7 are phase-detected by the PD 5. The output $V_{PD}$ of the PD 5 is fed back to the VCO 3 as a control voltage $V_F$ for the VCO 3 after elimination of useless noise in the LPF 8.

Figure 4A:
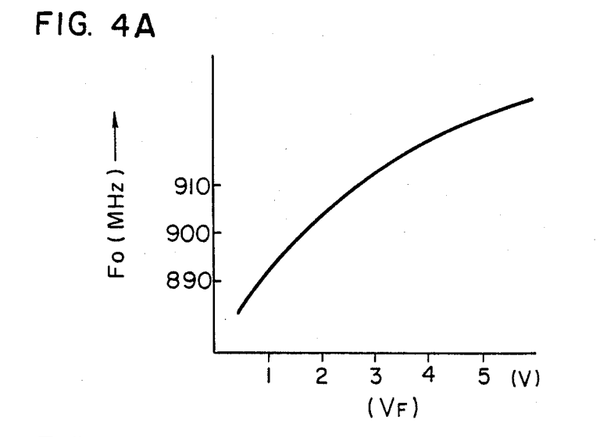
FIGS. 4A, 4B and 4C show various characteristics of the circuit of FIG. 3.
Figure 4B:
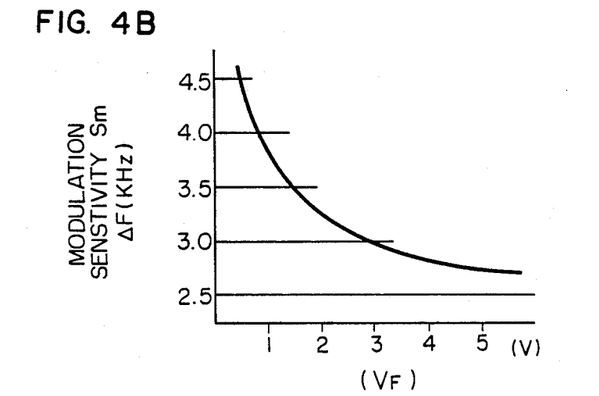
Figure 4C:
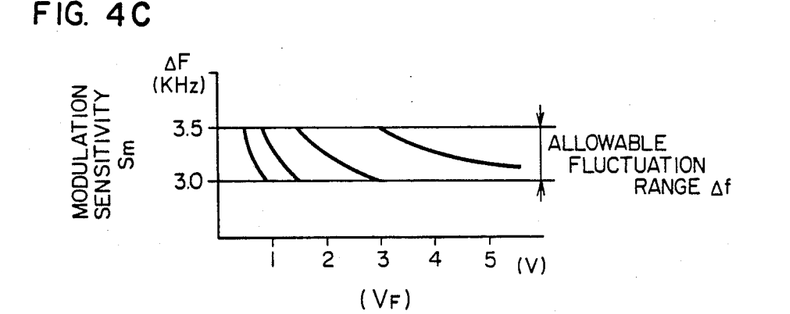

FIG. 4A shows the relation between the control voltage or signal $V_F$ applied from the LPF 8 to the VCO 3 and the oscillation frequency $F_0$ of the VCO 3, and FIG. 4B shows the relation of the modulation sensitivity Sm to the control signal $V_F$. The modulation sensitivity Sm changes if the oscillation frequency $F_0$ is changed on the basis of control signal $V_F$. Accordingly, if the voltage applied to the VCO 3 is changed in four steps by the level adjuster 2, the modulation sensitivity has four discontinuous characteristics with respective gradients which decrease as the channel number or frequency increases, as shown in FIG. 4C.

In such an arrangement, however, in order to accurately control the allowable fluctuation range of the transmission modulation sensitivity of a multi-channel radio equipment having 600 channels, 1000 channels, or the like, it is necessary to divide the channel of change-over of the modulation sensitivity into many steps, for example 6 steps, 10 steps, or the like. In that case, there is a problem in that it becomes necessary to provide a complicated control circuit including number of decoders.

SUMMARY OF THE INVENTION

It is therefore an object of the present invention to solve the problem in the prior art as described above.

It is another object of the present invention to provide a modulation sensitivity correction circuit for a voltage-controlled oscillator, in which the modulation sensitivity of the voltage-controlled oscillator can be continuously kept at a fixed value over a used channel having a wide range.

It is a further object of the present invention to provide a modulation sensitivity correction circuit for a voltage-controlled oscillator, which can be constituted by a simple arrangement in order to attain the above objects.

It is a still further object of the present invention to provide a modulation sensitivity correction circuit for a voltage-controlled oscillator, in which there is provided a reverse characteristic control voltage generation circuit for producing a control voltage having a characteristic reverse to the modulation sensitivity characteristic of the voltage-controlled oscillator and the modulation input is controlled on the basis of the output of a phase detector.

It is still another object of the present invention to provide a modulation sensitivity correction circuit for a voltage-controlled oscillator, in which there are provided an electronic volume control for changing in multi-steps the level of a modulation signal for a voltage-controlled oscillator, and means for correcting the output level of the electronic volume control on the basis of the output voltage of a phase detector or a low pass filter.

By the provision of such an arrangement as described above, in the modulation sensitivity correction circuit for a voltage-controlled oscillator according to the present invention, the level of the modulation signal for the voltage-controlled oscillator can be made continuous, so that the modulation sensitivity can be equalized and therefore a modulation characteristic which is flat over the entire range of a wide channel can be obtained.

DESCRIPTION OF THE PREFERRED EMBODIMENT

Figure 1:
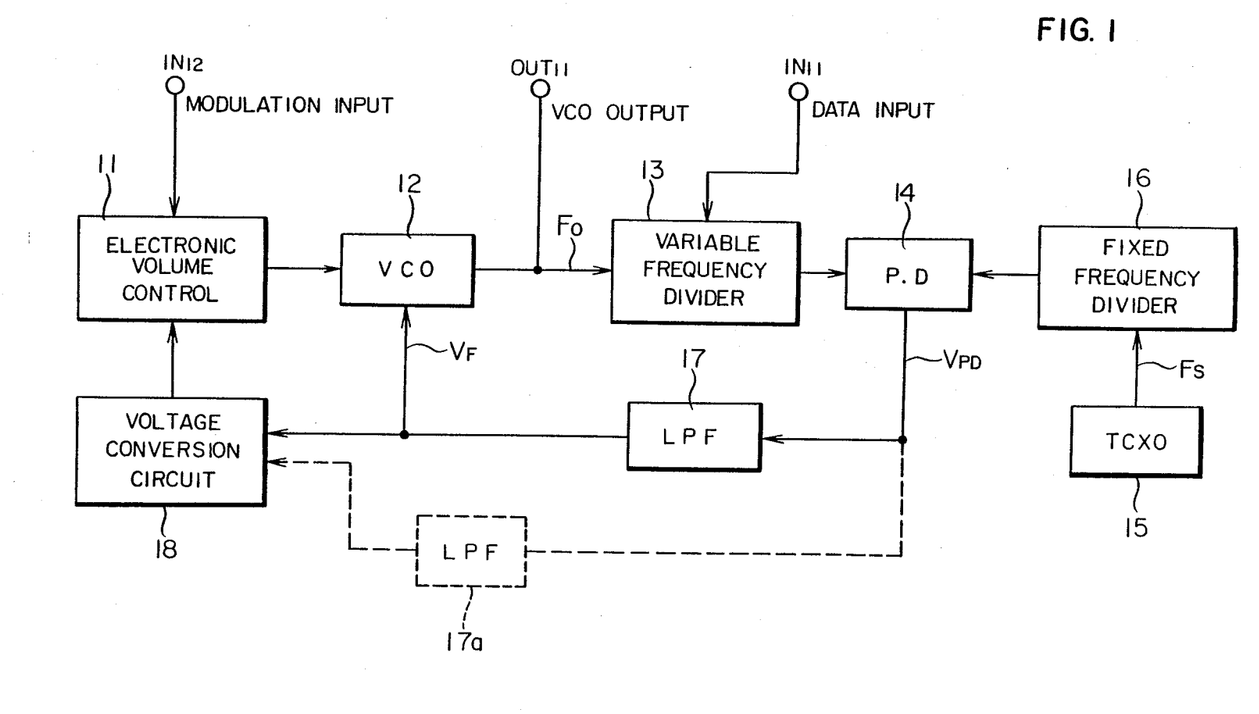
FIG. 1 is a block diagram showing an embodiment of the modulation sensitivity correction circuit for a voltage-controlled oscillator according to the present invention.

Referring to the drawings, an embodiment of the present invention will be described hereunder. FIG. 1 is a block diagram showing an embodiment of the modulation sensitivity correction circuit for a voltage-controlled oscillator according to the present invention.

Figure 2A:
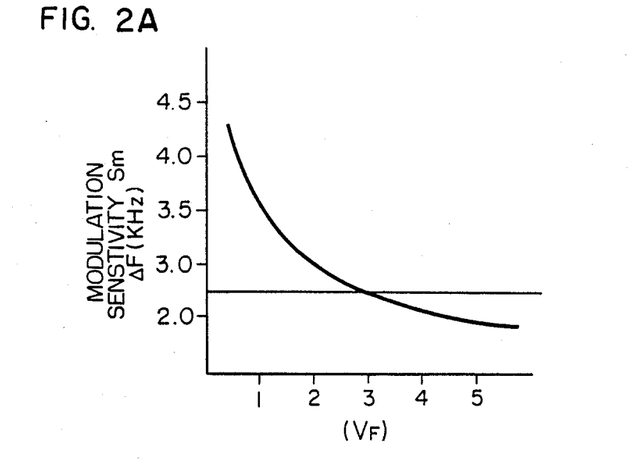
FIGS. 2A, 2B and 2C show various characteristics of the circuit of FIG. 1.
Figure 2B:
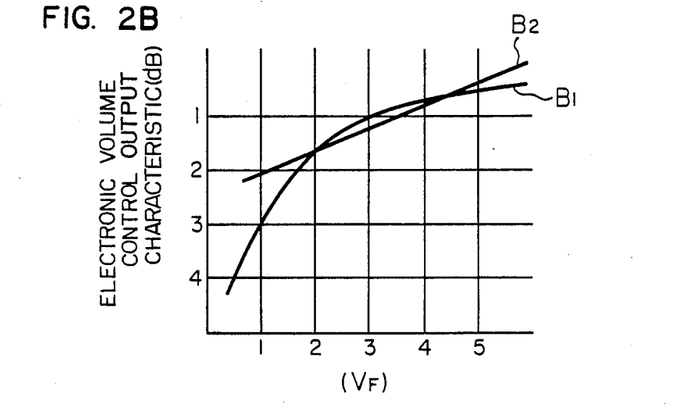

In FIG. 1, the modulation sensitivity correction circuit is provided with: an electronic volume control 11, such as a DC volume control, exhibiting an output characteristic as shown in FIG. 2B and for changing in multi-steps the level of a modulation signal applied through an input terminal $IN_{12}$; a voltage-controlled oscillator (VCO) 12 for producing a signal of an oscillation frequency $F_0$ having such a modulation sensitivity characteristic as shown in FIG. 2A; a variable frequency divider 13 for dividing the oscillation frequency $F_0$ of the VCO 12 into a predetermined frequency on the basis of the data from a data input terminal $IN_{12}$; a phase detector (PD) 14; a temperature compensated crystal oscillator (TCXO) 15 which acts as a highly stable reference oscillator; a fixed frequency divider 16 for dividing the oscillation frequency $F_s$ of the TCXO 15 into a predetermined frequency; a low pass filter (LPF) 17 for eliminating noise in the output signal $V_{PD}$ of the PD 14; a voltage conversion circuit 18 for correcting the output level of the electronic tuner 11 on the basis of the control voltage $V_F$ from the LPF 17; and an output terminal $OUT_{11}$ of the VCO 12.

FIG. 2A shows the relation of the modulation sensitivity Sm to the control voltage $V_F$, the relation being the same as the characteristic explained with respect to FIG. 4B.

FIG. 2B shows the relation between the control voltage $V_F$ applied to the VCO 12 from the LPF 17 and the output characteristic of the electronic volume control 11. In FIG. 2B, the curve $B_1$ is an ideal curve for making the charge of modulation sensitivity Sm be "0" and $B_2$ is a curve obtained when a modification of $\{(V_F/K)+V_b\}$ (K being a constant and $V_b$ a bias voltage) is added to the linear change of the control voltage $V_F$. The ideal curve can be approximated by using a combination of more than one different linear curves such as $B_2$.

Figure 2C:
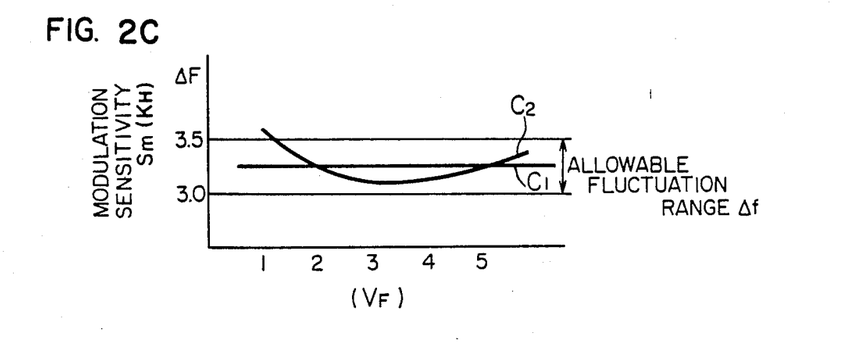

FIG. 2C shows the relation between the modulation sensitivity Sm ($C_1$, $C_2$) corrected by the circuit of FIG. 1 and the control voltage $V_F$.

The operation of the thus arranged embodiment will be now described. The oscillation frequency $F_0$ of the VCO 12 is divided by the variable frequency divider 13 into a predetermined frequency which is in turn applied to the PD 14 on one hand, and the oscillation frequency $F_s$ of the TCXO 15 is divided by the fixed frequency divider 16 into a predetermined frequency which is in turn applied also to the PD 14 on the other hand. The respective output signals of the variable frequency divider 13 and the fixed frequency divider 16 are phase detected by the PD 14. The output $V_{PD}$ of the PD 14 is fed back to the VCO 12 as a control voltage $V_F$ for the VCO 12 after elimination of noise in the LPF 17.

In the above operation, the oscillation frequency $F_0$ of the VCO 12 changes with the control voltage $V_F$ in such a manner as shown in FIG. 4A, and the modulation sensitivity for obtaining the same modulation degree is greatly curved relative to the control voltage $V_F$ as shown in FIG. 2A.

Accordingly, by making the output characteristic of the electronic volume control 11, i.e., the composite characteristic of the voltage conversion circuit 18 and the electronic volume control 11 relative to the control voltage $V_F$ (IV-5V) be the ideal curve $B_1$ as shown in FIG. 2B, the modulation sensitivity Sm can be a straight line $C_1$ relative to the control voltage $V_F$ as shown in FIG. 2C.

Further, by making the output characteristic of the electronic volume control 11 be the straight line $B_2$ shown in FIG. 2B, which is given by $\{(V_F/K)+V_b\}$ (K being a constant and $V_b$ being a bias voltage), the modulation sensitivity Sm becomes a curve $C_2$ which is continuous within an allowable fluctuation range $\Delta f$ as shown in FIG. 2C.

Figure 5A:
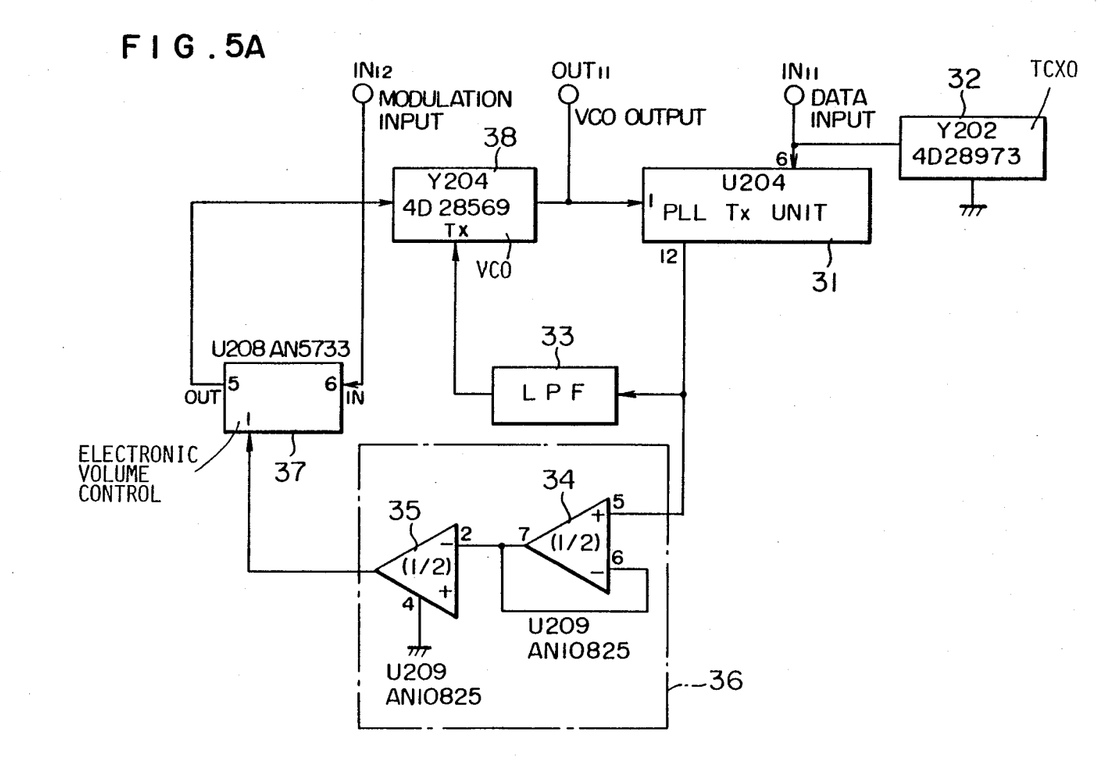
FIGS. 5A and are circuit diagrams of the embodiment shown in FIG. 1 and its voltage conversion circuit.
Figure 5B:
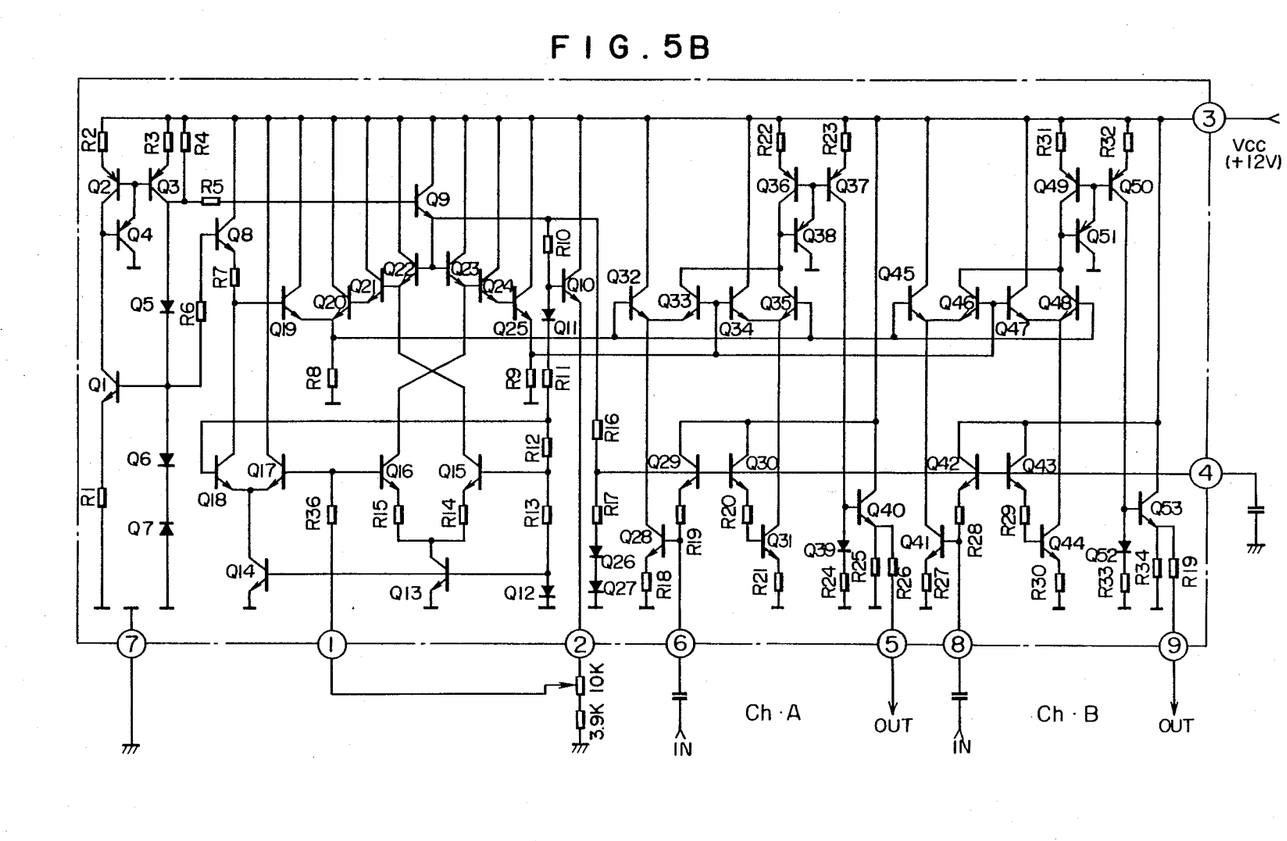

FIG. 5A shows a specific circuit diagram of the embodiment shown in FIG. 1, and FIG. 5B shows a detailed circuit diagram of the electronic volume control.

In FIG. 5A, PLL TX UNIT 31 is an IC including the variable frequency divider 13, phase detector 14 and fixed frequency divider 16 as shown in FIG. 1 and receives through pin 6 the reference signal supplied from TCXO 32 and also channel data. The PLL TX UNIT 31 supplies through pin 12 the output signal to be inputted to LPF 33 composed of resistors and capacitors and to the voltage conversion circuit 36 composed of buffer amplifier 34 and DC amplifier 35. The voltage conversion circuit 36 supplies the output signal to pin 1 of the electronic volume control 37 composed of an IC shown in FIG. 5B, while the control 37 receives the modulation input signal through pin 6. VCO 38 composed of an IC receives the output signal supplied from pin 5 of the electronic volume control 37 and the output signal supplied from the LPF 33. The VCO 38 generates the output signal to be externally taken out and to be inputted to pin 1 of the PLL TX UNIT 31.

Figure 6:
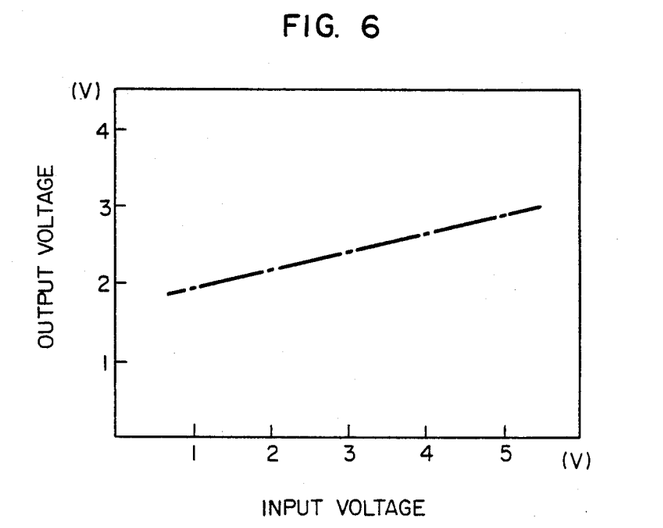
FIG. 6 is a characteristic diagram of the voltage conversion circuit.

In the above-mentioned arrangement, the voltage conversion circuit 36 can easily realize a voltage conversion characteristic such that the output voltage is represented by a linear function of the input voltage as shown in FIG. 6.

Further, in FIG. 1, the control voltage $V_F$ for VCO 18 may be applied from the PD 14 directly to the voltage conversion circuit 18 without passing through the LPF 17. At that time, alternatively, the control voltage $V_F$ may be applied from the PD 14 to the voltage conversion circuit 18 through another LPF 17a as shown by a broken line in FIG. 1 so as to prevent noise of the VCO from entering the voltage conversion circuit 18.

We claim:

1. A modulation sensitivity correction circuit for a voltage-controlled oscillator comprising:
    a voltage-controlled oscillator;
    a first frequency divider circuit for dividing the oscillation frequency of said voltage-controlled oscillator;
    a reference oscillator;
    a second frequency divider circuit for dividing the oscillation frequency of said reference oscillator;
    a phase detection means for phase-detecting the respective outputs of said first and second frequency divider circuits;
    a low pass filter for eliminating noise in the output voltage from said phase detection means to thereby produce a control signal for said voltage-controlled oscillator;
    an electronic volume control receiving a modulation signal for changing in multi-steps the level of said modulation signal for outputting to said voltage-controlled oscillator; and
    a correction means for correcting said multi-stepped level of said modulation signal in said electronic volume control on the basis of said output voltage of said phase detection means so that the level of said modulation signal applied to said voltage-controlled oscillator is continuous over the frequency range of said voltage-controlled oscillator.

2. A correction circuit according to claim 1 wherein said voltage-controlled oscillator has a modulator sensitivity characteristic, and wherein said correction means includes a conversion circuit having a characteristic which is the reverse of the modulation sensitivity characteristics of said voltage-controlled oscillator, said conversion circuit being responsive to the control signal produced by said low pass filter.

3. A correction circuit according to claim 2, in which said reverse characteristic is approximated as a combination of more than one linear characteristic.

4. A correction circuit according to claim 1, in which said correction means is constituted by a DC amplifier.

5. A correction circuit according to claim 1 wherein said correction means corrects on the basis of the control signal produced by said low pass filter.

6. A modulation sensitivity correction circuit for a voltage-controlled oscillator comprising:
- a voltage-controlled oscillator;
- a first frequency divider circuit for dividing the oscillation frequency of said voltage-controlled oscillator;
- a reference oscillator;
- a second frequency divider circuit for dividing the oscillation frequency of said reference oscillator;
- a phase detection means for phase-detecting the respective outputs of said first and second frequency divider circuits to produce a phase-detected output voltage, said voltage-controlled oscillator being controlled by said phase detected output voltage;
- an electronic volume control receiving a modulation signal for changing in multi-steps the level of said modulation signal for outputting to said voltage-controlled oscillator; and
- a correction means for correcting said multi-stepped level of said modulation signal in said electronic volume control on the basis of said output voltage of said phase detection means so that the level of said modulation signal applied to said voltage-controlled oscillator is continuous over the frequency range of said voltage-controlled oscillator.

7. A correction circuit according to claim 6 which further comprises a low pass filter interposed between the output of said phase detection means and said correction means, said low pass filter providing the filtered output of said phase detection means to said correction means.

* * * * *